US012693601B2

(12) United States Patent
Kato et al.

(10) Patent No.: US 12,693,601 B2
(45) Date of Patent: Jul. 28, 2026

(54) EXPOSURE APPARATUS, EXPOSURE METHOD, AND MANUFACTURING METHOD FOR ELECTRONIC DEVICE

(71) Applicant: NIKON CORPORATION, Tokyo (JP)

(72) Inventors: Masaki Kato, Yokohama (JP); Hitoshi Mizuno, Yokohama (JP); Yasushi Mizuno, Saitama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 18/538,032

(22) Filed: Dec. 13, 2023

(65) Prior Publication Data

US 2024/0111215 A1     Apr. 4, 2024

Related U.S. Application Data

(63) Continuation of application No. PCT/JP2022/026494, filed on Jul. 1, 2022.

(30) Foreign Application Priority Data

Jul. 5, 2021     (JP) ................................. 2021-111762

(51) Int. Cl.
G03F 7/00 (2006.01)
G02B 26/08 (2006.01)

(52) U.S. Cl.
CPC ...... G03F 7/70191 (2013.01); G02B 26/0833 (2013.01)

(58) Field of Classification Search
CPC .... G03F 7/70191; G03F 7/70291; G03F 7/20; G03F 7/70516; G03F 7/70116; G03F 7/70358; G03F 7/7085; G02B 26/0833
See application file for complete search history.

(56) References Cited

U.S. PATENT DOCUMENTS

| | | | | |
|---|---|---|---|---|
| 9,599,906 | B2 * | 3/2017 | Watanabe | ........... G03F 7/70291 |
| 2008/0205744 | A1 * | 8/2008 | Mushano | ............ G03F 7/70291 |
| | | | | 382/144 |

(Continued)

FOREIGN PATENT DOCUMENTS

| | | |
|---|---|---|
| JP | 2004079831 A | 3/2004 |
| JP | 2005-266779 A | 9/2005 |

(Continued)

OTHER PUBLICATIONS

Sep. 13, 2022 International Search Report issued in International Patent Application No. PCT/JP2022/026494.

(Continued)

*Primary Examiner* — Hung V Nguyen
(74) *Attorney, Agent, or Firm* — Oliff PLC

(57)     ABSTRACT

An exposure apparatus includes an illumination optical system, a spatial light modulator illuminated by light from the illumination optical system, a projection optical system that irradiates an exposure target with light emitted from the spatial light modulator, a stage on which the exposure target is placed to perform a relative movement between the exposure target and the projection optical system relative to each other in a predetermined scanning direction, and a controller that has a storage in which information relating to exposure pattern is stored and controls exposure for the exposure target. The controller controls the exposure for the exposure target so that a first step of performing a first exposure based on the information relating to the exposure pattern and a second step of performing a second exposure based on at least a portion of the information relating to the exposure pattern used in the first step are executed.

28 Claims, 7 Drawing Sheets

(56)            References Cited

U.S. PATENT DOCUMENTS

| | | |
|---|---|---|
| 2009/0244466 A1 | 10/2009 | Tojo et al. |
| 2010/0141732 A1 | 6/2010 | Sasaki et al. |
| 2016/0091794 A1* | 3/2016 | Shibata ............... G03F 7/70558 |
| | | 355/77 |
| 2020/0348597 A1 | 11/2020 | Hochleitner et al. |

FOREIGN PATENT DOCUMENTS

| | | |
|---|---|---|
| JP | 2005-303042 A | 10/2005 |
| JP | 2006-337576 A | 12/2006 |
| JP | 2008-116708 A | 5/2008 |
| JP | 2008-171947 A | 7/2008 |
| JP | 2009-204982 A | 9/2009 |
| JP | 2009-251013 A | 10/2009 |
| JP | 2018-121060 A | 8/2018 |
| JP | 2020-198427 A | 12/2020 |
| JP | 2021-056472 A | 4/2021 |
| KR | 10-2019-0072573 A | 6/2019 |
| TW | 200727751 A | 7/2007 |

OTHER PUBLICATIONS

Sep. 13, 2022 Written Opinion issued in International Patent Application No. PCT/JP2022/026494.
Feb. 18, 2025 Office Action issued in Japanese Patent Application No. 2023-533107.
Apr. 24, 2025 Office Action issued in Korean Patent Application No. 10-2023-7044650.
Jul. 8, 2025 Office Action issued in Japanese Patent Application No. 2023-533107.
Oct. 28, 2025 Decision of Dismissal of Amendment issued in Japanese Patent Application No. 2023-533107.
Mar. 26, 2026 Office Action issued in Chinese Patent Application No. 202280045775.3.
Apr. 28, 2026 Office Action issued in Taiwanese Patent Application No. 111124949.

* cited by examiner

EXPOSURE APPARATUS, EXPOSURE METHOD, AND MANUFACTURING METHOD FOR ELECTRONIC DEVICE

CROSS-REFERENCE TO RELATED APPLICATION

This is a Continuation Application of International Application No. PCT/JP2022/026494, filed Jul. 1, 2022, which claims priority to Japanese Patent Application No. 2021-111762, filed Jul. 5, 2021. The contents of the aforementioned applications are incorporated herein by reference.

BACKGROUND

Field of the Invention

The present invention relates to an exposure apparatus, an exposure method, and a method of manufacturing an electronic device.

Description of Related Art

Conventionally, as an exposure apparatus that irradiates a substrate with illumination light through an optical system, an exposure apparatus that passes light modulated using a spatial light modulator through a projection optical system and forms an image of the light on a resist applied on a substrate to perform exposure has been known (see, for example, Japanese Patent Application, Publication No. 2005-266779).

SUMMARY

According to a first aspect of the present invention, there is provided an exposure apparatus including: an illumination optical system; a spatial light modulator which is illuminated by light from the illumination optical system; a projection optical system that irradiates an exposure target with light emitted from the spatial light modulator; a stage on which the exposure target is placed to perform a relative movement between the exposure target and the projection optical system in a predetermined scanning direction; and a controller that has a storage in which information relating to an exposure pattern is stored and controls exposure for the exposure target, wherein the controller controls the exposure for the exposure target so that a first step of performing a first exposure based on the information relating to the exposure pattern and a second step of performing a second exposure based on at least a portion of the information relating to the exposure pattern used in the first step are executed.

According to a second aspect of the present invention, there is provided an exposure method of exposing an exposure target using an exposure apparatus including an illumination optical system, a spatial light modulator which is illuminated by light from the illumination optical system, a projection optical system that irradiates an exposure target with light emitted from the spatial light modulator, a stage on which the exposure target is placed to perform a relative movement between the exposure target and the projection optical system in a predetermined scanning direction, and a controller that has a storage in which information relating to an exposure pattern is stored and controls exposure for the exposure target, wherein the method includes: a first step of performing a first exposure based on the information relating to the exposure pattern; and a second step of performing a second exposure based on at least a portion of the information relating to the exposure pattern used in the first step.

According to a third aspect of the present invention, there is provided a method of manufacturing an electronic device, the method including exposing the exposure target using the above exposure method.

DESCRIPTION OF EMBODIMENTS

Figure 1:
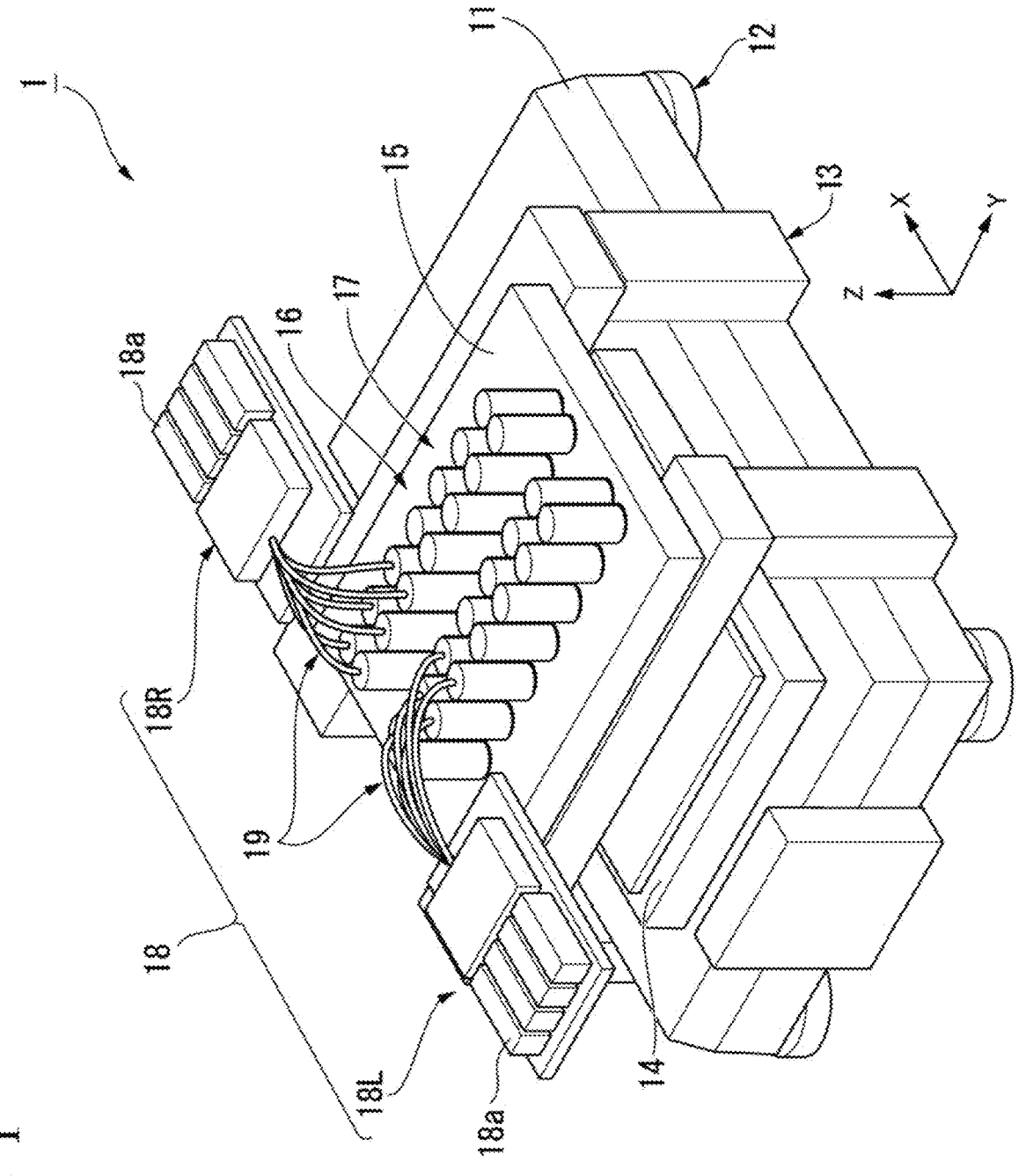
FIG. 1 is a diagram illustrating an overview of an external configuration of an exposure apparatus according to the present embodiment.

Hereinafter, an embodiment of the present invention will be described with reference to the accompanying drawings. The following detailed description of the present invention is intended to be illustrative only and not limiting. The same or similar reference numerals and signs are used throughout the drawings and the following detailed description.

[Exposure Apparatus]

FIG. 1 is a diagram illustrating an overview of an external configuration of an exposure apparatus 1 according to the present embodiment. The exposure apparatus 1 is an apparatus that irradiates an exposure target with modulated light. In a specific embodiment, the exposure apparatus 1 is a so-called scanner which is a step-and-scan projection exposure apparatus that uses a rectangular (polygonal) glass substrate used for an electronic device such as a liquid crystal display (flat panel display) as an exposure target. A length of one side or a diagonal length of the glass substrate which is an exposure target may be equal to or greater than 500 mm. The glass substrate which is an exposure target may be a substrate for a flat panel display. The exposure target (for example, a substrate for a flat panel display) exposed by the exposure apparatus 1 is developed to be used as a product. A resist is provided on the surface of the exposure target.

The main body of the exposure apparatus 1 is configured similarly to the main body of an apparatus disclosed in, for example, the specification of US Patent Application Publication No. 2008/0030702.

The exposure apparatus 1 includes a base 11, a vibration-isolating table 12, a main column 13, a stage 14, an optical surface plate 15, an illumination nodule 16, a projection module 17 (projection optical system), a light source unit 18, an optical fiber 19, a light modulation unit 20 (not shown in FIG. 1), and a controller 21.

In the following description, a three-dimensional orthogonal coordinate system in which the direction parallel to the optical axis direction of the projection module 17 that irradiates an exposure target with light modulated by the light modulation unit 20 is defined as a Z-axis direction, and the directions of a predetermined plane orthogonal to the Z axis are defined as an X-axis direction and a Y-axis direction will be used as necessary. The X-axis direction and the Y-axis direction are directions which are orthogonal to (intersect) each other. In the present embodiment, the X-axis direction is the scanning movement direction of an exposure target (substrate) 23, and the Y-axis direction is the stepping direction of the exposure target (substrate) 23.

The base 11 is a base of the exposure apparatus 1 and is installed on the vibration-isolating table 12. The base 11 supports the stage 14 on which an exposure target is placed so as to be movable in the X-axis direction and the Y-axis direction.

The stage 14 is used to support an exposure target. The stage 14 is used to position an exposure target with a high degree of accuracy with respect to a plurality of partial images of a circuit pattern projected through the projection module 17 during scanning exposure. The stage 14 drives the exposure target in the directions of six degrees of freedom (the above-described X-axis. Y-axis, and Z-axis directions and rotation directions with respect the axes).

The stage 14 is moved in the X-axis direction during scanning exposure, and is moved in the Y-axis direction when changing a region to be exposed on the exposure target. Meanwhile, a plurality of regions to be exposed are formed on the exposure target. The stage 14 moves the exposure target and the projection module 17 relative to each other in the scanning direction.

The exposure apparatus 1 makes it possible to expose each of a plurality of regions to be exposed on one exposure target. Although the configuration of the stage 14 is not particularly limited, a stage device such as that disclosed in the specification of US Patent Application Publication No. 2012/0057140 or the like can be used. The stage device is, for example, a stage device having a so-called coarse-fine movement configuration which includes a two-dimensional coarse movement stage of a gantry type and a fine movement stage driven slightly with respect to the two-dimensional coarse movement stage. The stage device having a coarse-fine movement configuration is configured so that the coarse movement stage allows the exposure target to move in the directions of three degrees of freedom within the horizontal plane and that the fine movement stage allows the exposure target to move finely in the directions of six degrees of freedom.

The main column 13 supports the optical surface plate 15 above the stage 14 (in the positive direction of the Z axis). The optical surface plate 15 supports the illumination module 16, the projection module 17, and the light modulation unit 20.

Figure 2:
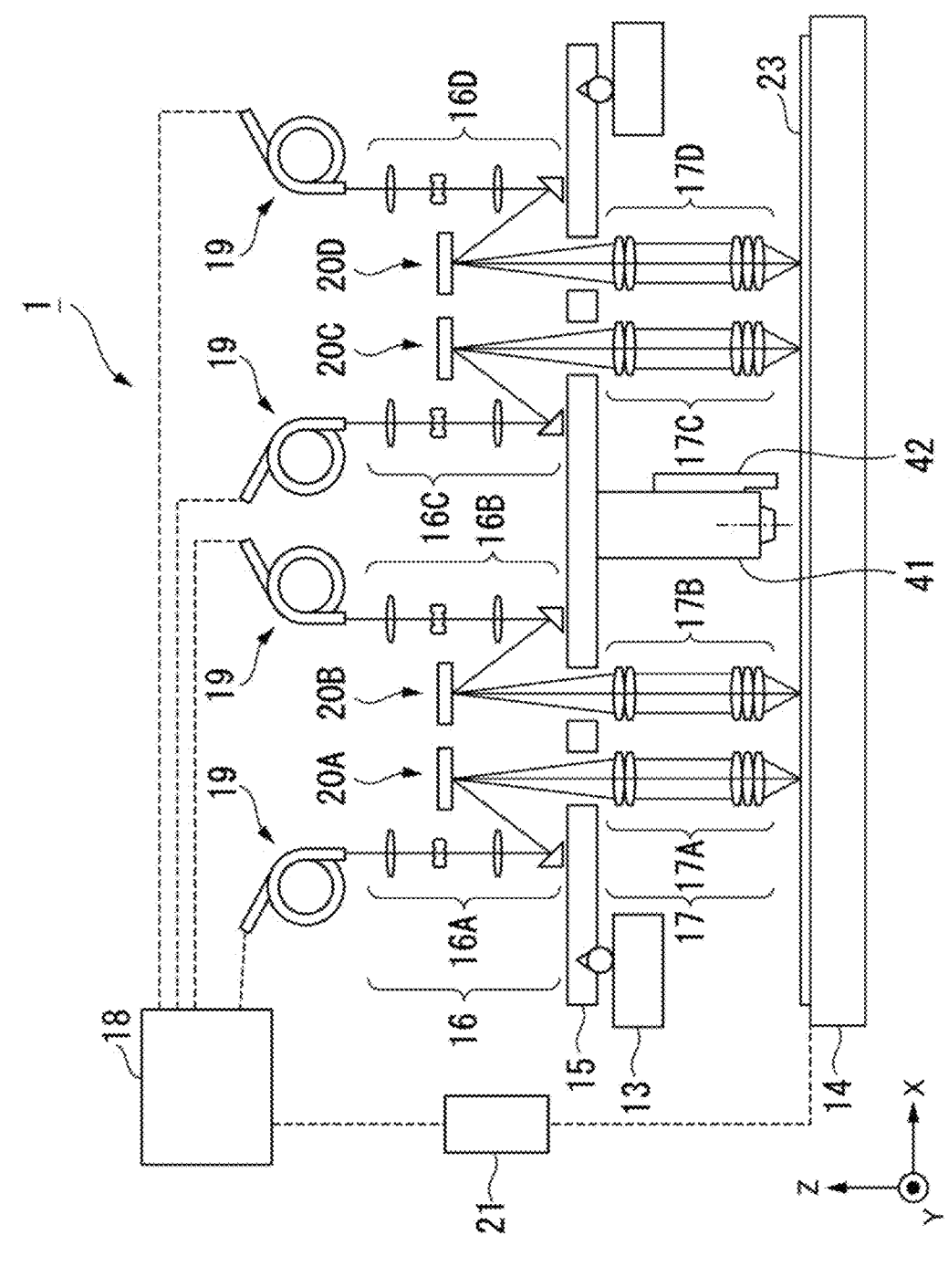
FIG. 2 is a diagram illustrating an overview of a configuration of an illumination module and a projection module.

FIG. 2 is a diagram illustrating an overview of the configuration of the illumination module 16, the projection module 17, and the light modulation unit 20.

The illumination module 16 is disposed above the optical surface plate 15 and is connected to the light source unit 18 through the optical fiber 19. In an example of the present embodiment, the illumination module 16 includes a first illumination module 16A, a second illumination module 16B, a third illumination module 16C, and a fourth illumination module 16D. In the following description, in a case where the first illumination module 16A to the fourth illumination module 16D need not be distinguished from each other, they are collectively referred to as the illumination module 16.

The first illumination module 16A to the fourth illumination module 16D guide light, which are emitted from the light source unit 18 through the optical fiber 19, to a first light modulation unit 20A, a second light modulation unit 20B, a third light modulation unit 20C, and a fourth light modulation unit 20D, respectively. The illumination module 16 illuminates the light modulation unit 20.

As will be described in more detail in a later section, the light modulation unit. 20 is controlled on the basis of drawing data (data of a two-dimensional bitmap format or the like) of a circuit pattern to be transferred to the exposure target, and spatially modulates illumination light from the illumination module 16. The modulated light (light distribution corresponding to a pattern) modulated by the light modulation unit 20 is guided to the projection module 17. The first light modulation unit 20A to the fourth light modulation unit 20D are disposed at different positions from each other on the XY plane. In the following description, in a case where the first light modulation unit 20A to the fourth light modulation unit 20D need not be distinguished from each other, they are collectively referred to as the light modulation unit 20.

The projection module 17 is disposed below the optical surface plate 15 and irradiates the exposure target placed on the stage 14 with modulated light modulated by a spatial light modulator 201. The projection module 17 forms an image of the light modulated by the light modulation unit 20 on the exposure target, and exposes the exposure target. In other words, the projection module 17 projects a pattern on the light modulation unit 20 onto the exposure target. In an example of the present embodiment, the projection module 17 includes a first projection module 17A to a fourth projection module 17) that correspond to the first illumination module 16A to the fourth illumination module 16D and the first light modulation unit 20A to the fourth light modulation unit 20D described above. In the following description, in a case where the first projection module 17A to the fourth projection module 17D need not be distinguished from each other, they are collectively referred to as the projection module 17.

A unit constituted by the first illumination module 16A, the first light modulation unit 20A, and the first projection module 17A is referred to as a first exposure module. Similarly, a unit constituted by the second illumination module 16B, the second light modulation unit 20B, and the second projection module 17B is referred to as a second exposure module. The exposure modules are provided at different positions from each other on the XY plane, and can expose patterns at different positions of the exposure target placed on the stage 14. The stage 14 moves relative to the exposure module in the X-axis direction which is a scanning direction so that the entire surface of the exposure target or the entire surface of the region can be scanned and be exposed. In addition, as can be seen from FIG. 1, the first illumination module 16A, the first projection module 17A, and the first light modulation unit 20A in FIG. 2 are also disposed side by side in the Y-axis direction. Similarly, the second illumination module 168, the second projection module 178, and the second light modulation unit 208 in FIG. 2 are also disposed side by side in the Y-axis direction. Similarly, the third illumination module 16C, the third projection module 17C, and the third light modulation unit 20C in FIG. 2 are also disposed side by side in the Y-axis direction. Similarly, the fourth illumination module 16D, the fourth projection module 17D, and the fourth light modulation unit 20D in FIG. 2 are also disposed side by side in the Y-axis direction.

Meanwhile, the illumination module 16 is also referred to as an illumination system. The illumination module 16 (illumination system) illuminates the spatial light modulator 201 (spatial light modulation element) of the light modulation unit 20 to be described later.

In addition, the projection module 17 is also referred to as a projection unit. The projection module 17 (projection unit) may be an equal-magnification system that projects an image of a pattern on the light modulation unit 20 at an equal magnification, or may be an enlargement system or a reduction system. In addition, it is preferable that the projection module 17 be constituted by one or two types of glass materials (especially quartz or fluorite).

As shown in FIG. 1, a pair of light source units 18 (a light source unit R18R and a light source unit L18L) are provided. As the light source unit 18, a light source unit using a highly coherent laser as a light source, a light source unit using a light source such as a semiconductor laser-type UV-LD, and a light source unit using a lens relay-type retarder can be adopted. Examples of a light source 18a included in the light source unit 18 include a lamp, a laser diode, or the like that emits a wavelength such as 405 nm or 365 nm. The light source unit 18 may include a light distribution system that supplies illumination light (pulsed light) with approximately the same illuminance to each optical fiber 19.

In addition to each unit described above, the exposure apparatus 1 includes a position measurement unit (not shown) composed of an interferometer, an encoder, and the like, and measures the relative position of the stage 14 with respect to the optical surface plate 15. In addition to each unit described above, the exposure apparatus 1 includes an auto focus (AF) unit 42 that measures the position of the stage 14 or the exposure target on the stage 14 in the Z-axis direction. The exposure apparatus 1 further includes an alignment unit 41 that measures the relative position of each pattern when a pattern (underlying layer) that has already been exposed on the exposure target is exposed to overlap another pattern. The AF unit 42 and/or the alignment unit 41 may be in a through-the-lens (TTL) configuration that performs measurement through the projection module 17.

Figure 3:
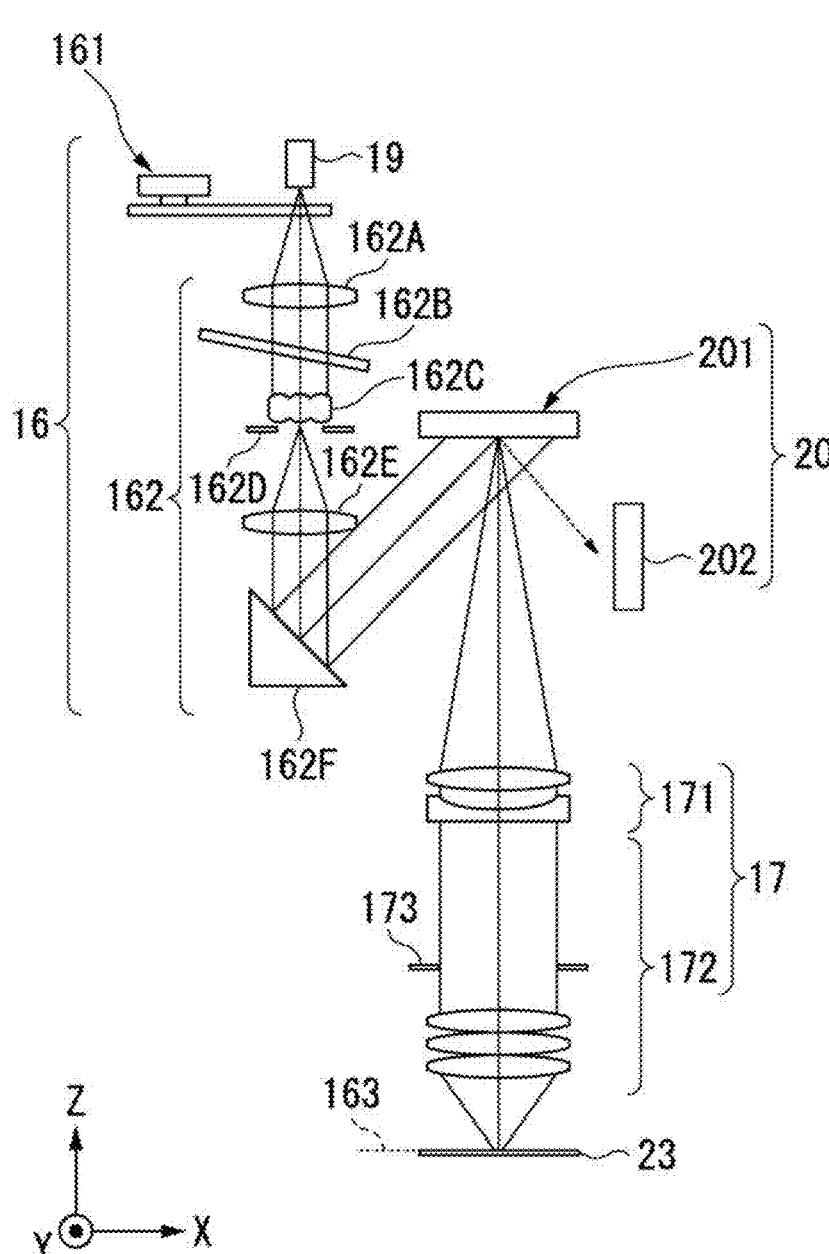
FIG. 3 is a diagram illustrating an overview of a configuration of the illumination module.

FIG. 3 is a diagram illustrating an overview of the configuration of the exposure module. An example of a specific configuration of the illumination module 16, the light modulation unit 20, and the projection module 17 will be described using the first exposure nodule as an example.

The illumination module 16 includes a module shutter 161 and an illumination optical system 162. The module shutter 161 switches whether the pulsed light supplied from the optical fiber 19 is guided to the illumination optical system 162.

The illumination optical system 162 illuminates the light modulation unit 20 almost uniformly by emitting the pulsed light supplied from the optical fiber 19 to the light modulation unit 20 through a collimator lens 162A, a fly-eye lens 162C, a capacitor lens 162E, and the like. The fly-eye lens 162C splits the wavefront of the pulsed light incident on the fly-eye lens 162C, and the capacitor lens 162E superimposes the wavefront-split light on the light modulation unit. Meanwhile, the illumination optical system 162 may include a rod integrator instead of the fly-eye lens 162C. The illumination optical system 162 of the present embodiment further includes a variable neutral density filter 162B, a variable aperture diaphragm 162D, and a plane mirror 162F. The variable neutral density filter 162B attenuates the illuminance of the illumination light (pulsed light) incident on the fly-eye lens 162C to adjust the amount of exposure. The variable aperture diaphragm 162D changes the illumination σ by adjusting the size (diameter) of a substantially circular light source image formed on the emission surface side of the fly-eye lens 162C. The plane mirror 162F reflects the illumination light (pulsed light) from the capacitor lens 162E so as to obliquely illuminate the spatial light modulator 201.

The light modulation unit 20 is a spatial light modulator (SLM) that functions as a variable mask for dynamically changing the distribution of reflected light at high speed.

The light modulation unit 20 includes the spatial light modulator 201 and an off-light absorption plate 202. The spatial light modulator 201 is a digital mirror device (digital micromirror device (DMD)). The spatial light modulator 201 can spatially and temporally modulate the illumination light.

Figure 4:
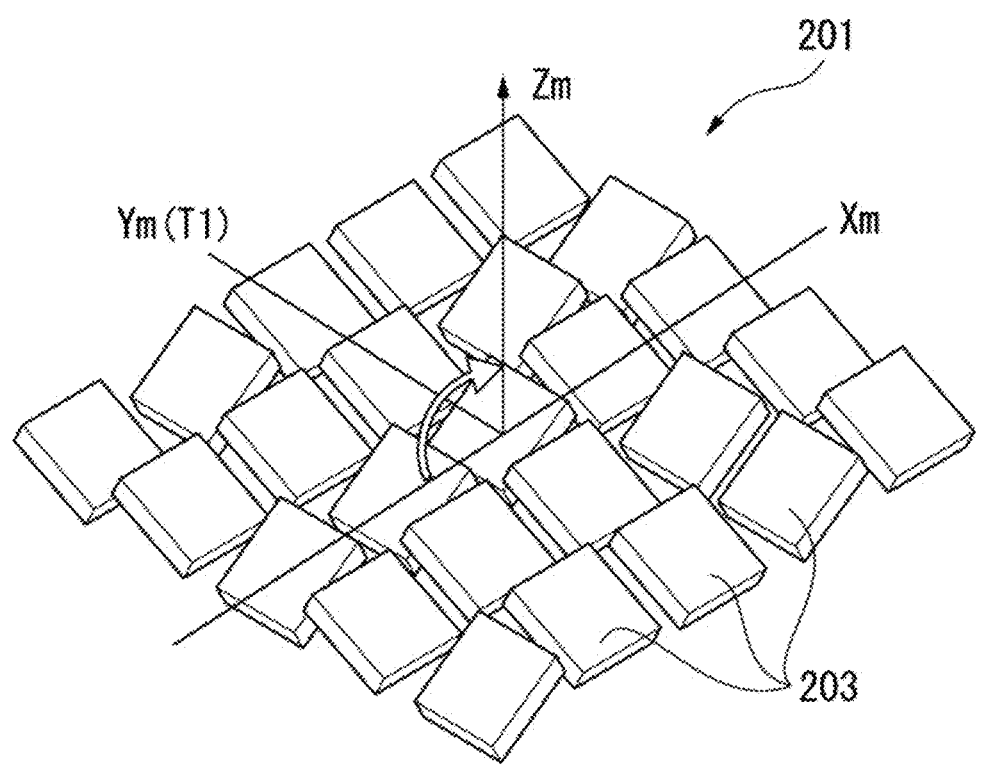
FIG. 4 is a diagram illustrating an overview of a configuration of a light modulation unit.
Figure 5:
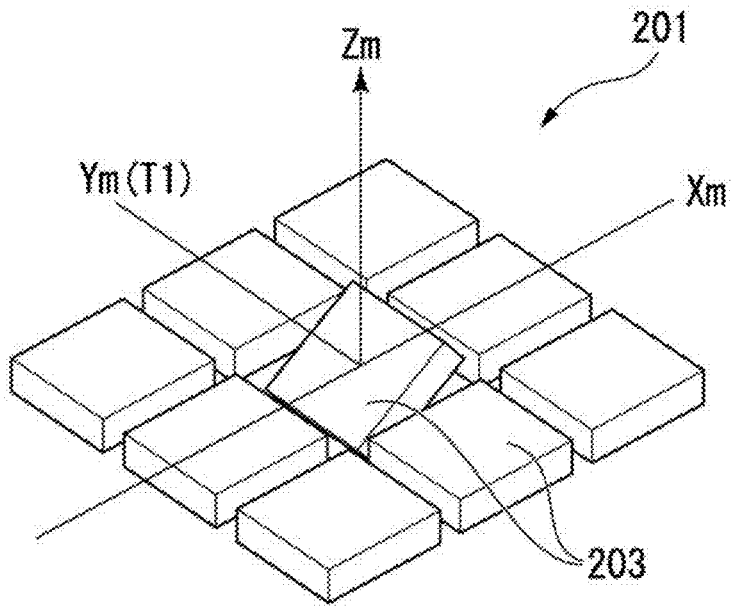
FIG. 5 is a diagram illustrating an overview of a configuration of the light modulation unit, and is a diagram illustrating an on state of a mirror at the center of the page.
Figure 6:
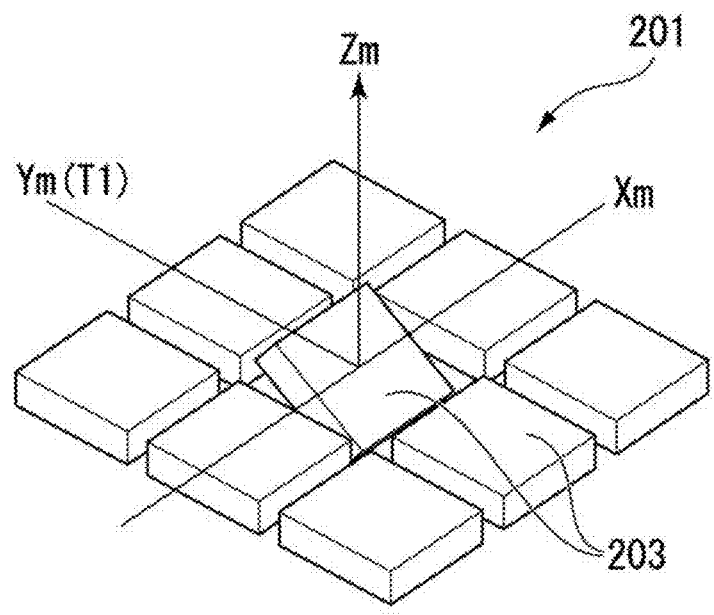
FIG. 6 is a diagram illustrating an overview of a configuration of the light S modulation unit, and is a diagram illustrating an off state of the mirror at the center of the page.

FIG. 4 is a diagram illustrating an overview of the configuration of the spatial light modulator 201 according to the present embodiment. In this drawing, description will be given using a three-dimensional orthogonal coordinate system of Xm axis, Ym axis, and Zn axis. The spatial light modulator 201 includes a plurality of micromirrors 203 (mirrors) arrayed on the Xm-Ym plane. Each of the micromirrors 203 constitutes an element (pixel) of the spatial light modulator 201. The micromirror 203 can change its inclination angle around the Xm axis and around the Yin axis. For example, the micromirror 203 is turned on by inclining around the Yin axis as shown in FIG. 5, and is turned off by inclining around the Xm axis as shown in FIG. 6.

The spatial light modulator 201 controls the reflection direction of incident light for each element by switching the inclination direction of the micromirror 203 for each micromirror 203 in accordance with drawing data. As an example, the digital micromirror device of the spatial light modulator 201 has a pixel count of about 4M pixels, and can switch the micromirror 203 between an on state and an off state at a cycle of about 10 kHz.

In the spatial light modulator 201, a plurality of elements are individually controlled at predetermined time intervals, in a case where the spatial light modulator 201 is a DMD, the element is the micromirror 203, and the predetermined time interval is a cycle (for example, a cycle of 10 kHz) at which the micromirror 203 is switched between an on state and an off state.

Referring back to FIG. 3, the off-light absorption plate 202 absorbs the light (off-light) emitted (reflected) from the off-state elements of the spatial light modulator 201. The light emitted from the on-state elements of the spatial light modulator 201 is guided to the projection module 17.

The projection module 17 projects the light emitted from the on-state elements of the spatial light modulator 201 onto the exposure target. The projection module 17 includes a magnification adjustment unit 171 and a focus adjustment unit 172. The light (modulated light) modulated by the spatial light modulator 201 is incident on the magnification adjustment unit 171.

The magnification adjustment unit 171 adjusts the magnification of an imaging plane 163 of the modulated light emitted from the spatial light modulator 201 by driving some lenses in the optical axis direction. The imaging plane 163 is an imaging plane (best focus plane) conjugate to the overall reflection surface of the spatial light modulator 201 which is created by the projection module 17. In other words, the magnification adjustment unit 171 adjusts the magnification of an image on the surface of the exposure target 23.

By driving the entire lens group in the optical axis direction, the focus adjustment unit 172 adjusts the imaging position, that is, the focus, so that the modulated light emitted from the spatial light modulator 201 is imaged on the surface of the exposure target measured by the AF unit 42 described above.

The projection module 17 projects only the image of the light emitted from the on-state elements of the spatial light modulator 201 onto the surface of the exposure target. Therefore, the projection module 17 can project and expose the image of the pattern formed by the on element of the spatial light modulator 201 onto the surface of the exposure target. That is, the projection module 17 can form spatially modulated light onto the surface of the exposure target. In addition, since the spatial light modulator 201 can switch the micromirror 203 between an on state and an off state at a predetermined cycle (frequency) as described above, the projection module 17 can form temporally modulated light (that is, modulated light in which the shape of brightness and darkness (light distribution) in the XY plane of an imaging light flux which is reflected by the spatial light modulator 201 and incident on the projection module 17 changes rapidly with time) onto the surface of the exposure target.

A variable aperture diaphragm 173 is provided at the pupil position of the projection module 17, which is used to adjust (limit) the numerical aperture (NA) on the substrate 23 side of the imaging light flux reflected by the on-state micromirror of the spatial light modulator 201 and to change the resolution and depth of focus DOF. The variable aperture diaphragm 162D and the variable aperture diaphragm 173 have an almost optically conjugate relationship.

In the spatial light modulator 201 shown in FIGS. 4 to 6, the Xm axis is parallel to the X axis, and the Ym axis is parallel to the Y axis. This causes the on-state micromirror 203 (the micromirror 203 inclined around the Yn axis) to be inclined with respect to the X-axis direction which is a scanning direction.

The Ym axis is also referred to as a first tilt axis T1. In the spatial light modulator 201, a plurality of micromirrors 203 each rotate around the first tilt axis T1 (YM axis), and the plurality of micromirrors 203 adjust their respective inclinations with respect to the scanning direction and enters an on state, thereby emitting light to the projection module 17.

Meanwhile, in the spatial light modulator 201, the plurality of micromirrors 203 are lined up linearly in the scanning direction, and the plurality of micromirrors 203 are also lined up in the direction of the first tilt axis T1.

As shown in FIG. 2, the controller 21 is constituted by, for example, a computer having an arithmetic unit such as a CPU and a storage. The computer controls each unit of the exposure apparatus 1 in accordance with a program for executing control of each unit that operates in exposure processing. The controller 21 controls, for example, the operations of the illumination module 16, the light modulation unit 20, the projection module 17, and the stage 14.

The storage is constituted using a computer readable storage medium device such as a memory. The storage stores various types of information relating to exposure processing. The storage stores, for example, information relating to an exposure pattern during exposure processing (drawing data information, recipe information such as target exposure amount or scanning exposure sequence). The storage stores, for example, information input through a communication unit or an input unit. The communication unit is configured to include a communication interface for connecting the exposure apparatus to an external device. The input unit is configured to include an input device such as a mouse, a keyboard, or a touch panel. The input unit accepts an input of various types of information for the exposure apparatus.

[Exposure Method]

The controller 21 controls the exposure of the exposure target 23 so that a first step and a second step to be described below are executed.

The stage 14 moves the exposure target relative to the exposure module in a predetermined scanning direction. Thereby, the light radiated by the exposure module scans the exposure target on the basis of the information relating to the exposure pattern stored in the storage, and a predetermined exposure pattern is formed.

(First Step)

Figure 7A:
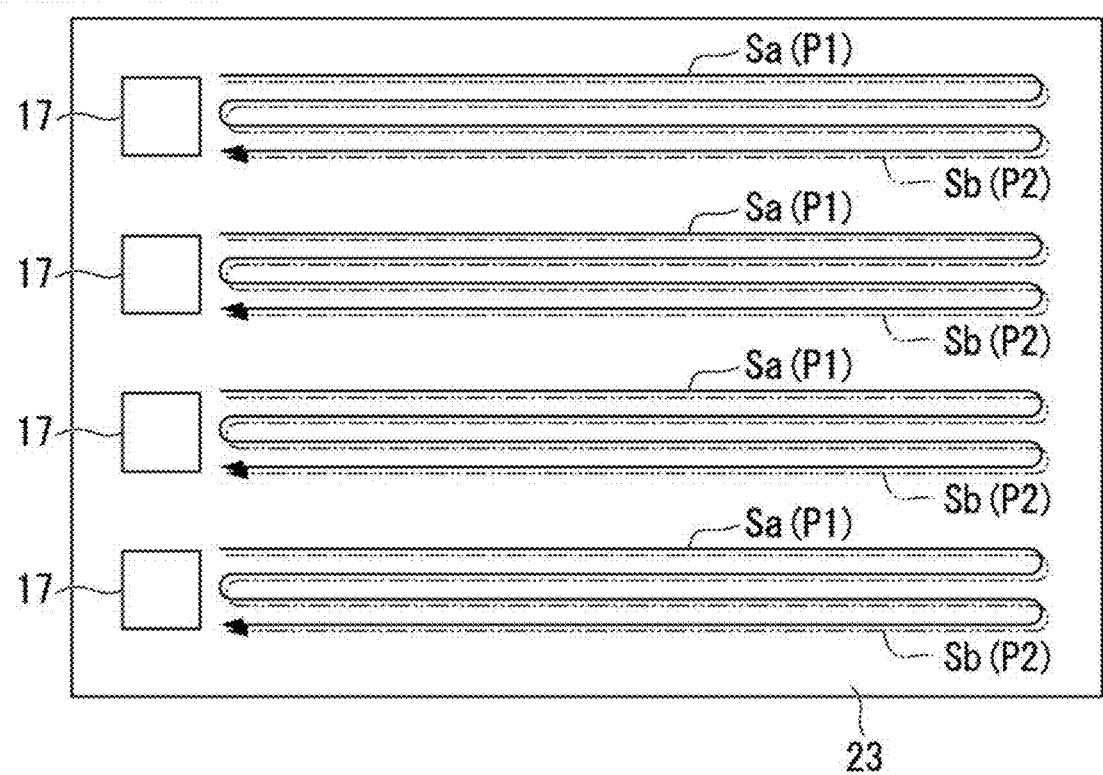
FIG. 7A is a plan view schematically illustrating an example of an exposure pattern in a case where a pattern to be exposed is exposed twice.

FIG. 7A is a plan view schematically illustrating an example of an exposure pattern in a case where a pattern to be exposed is exposed twice. As shown in FIG. 7A, the projection module 17 of each exposure module moves the exposure target. (substrate) 23 along a movement trajectory Sa and performs exposure processing (first exposure) to form a first exposure pattern on the substrate 23. The movement trajectory Sa has a reciprocating path that advances linearly in the right direction in FIG. 7A and then reverses and advances in the left direction once or multiple times. A pattern formed as a latent image on the resist layer of the substrate 23 through the first exposure along the movement trajectory Sa in FIG. 7A is referred to as a first exposure pattern P1. In FIG. 7A, the movement trajectory Sa (the first exposure pattern P1) is indicated by a solid line. In the second exposure, the substrate 23 is moved along a movement trajectory Sb that overlaps the movement trajectory Sa. The pattern exposed in the second exposure is referred to as a second exposure pattern P2.

Figure 7B:
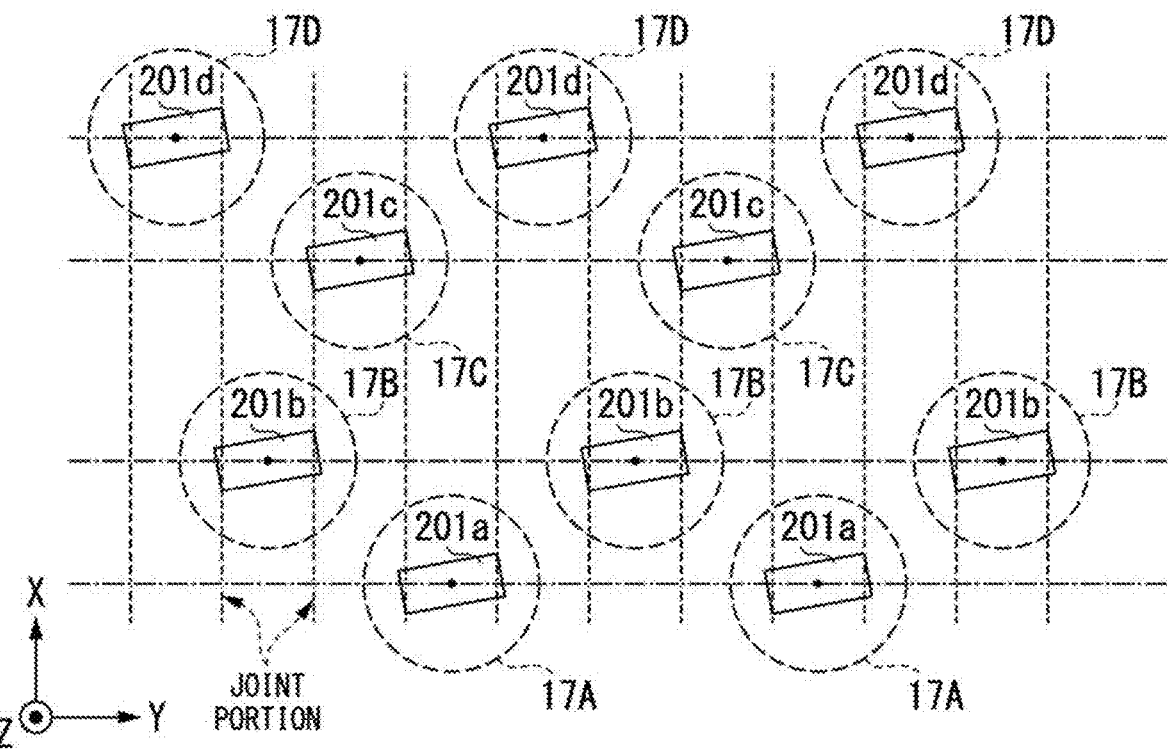
FIG. 7B is a diagram specifically illustrating an example of an arrangement relationship of a plurality of exposure modules.
Figure 7C:
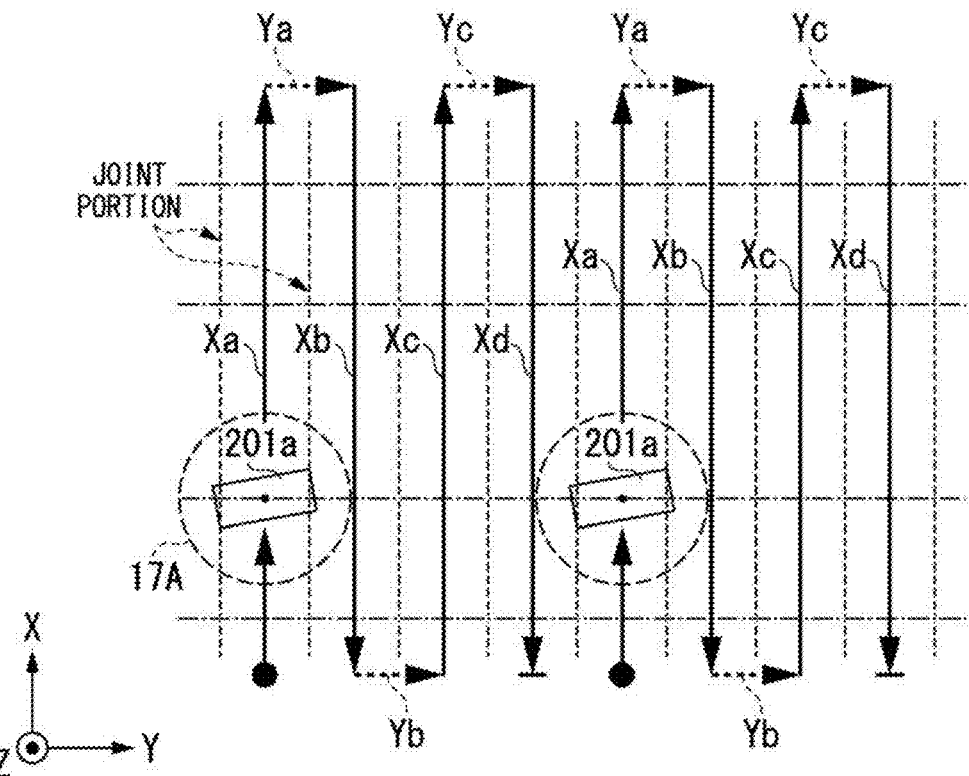
FIG. 7C is a diagram specifically illustrating another example of an arrangement relationship of the plurality of exposure modules.

FIG. 7B is a diagram specifically illustrating an example of the arrangement relationship of a plurality of exposure modules. FIG. 7C is a diagram specifically illustrating an example of the arrangement relationship of a plurality of exposure modules different from that shown in FIG. 7B. Based on the arrangement of FIGS. 1 and 2, a specific example of the arrangement relationship of a plurality of exposure modules will be described with reference to FIGS. 7B and 7C.

In FIG. 7B, reference numerals 17A, 17B, 17C, and 17D indicate projection modules, and reference numerals 201_a_, 201_b_. 201_c_, and 201_d_ indicate projection region (projected image range) of the spatial light modulator 201 projected onto the substrate 23 (on the imaging plane 163) by each projection module.

Each of the rectangular projection regions 201_a_ to 201_d_ is set to be inclined in the XY plane, and in the case of such an arrangement, a single scanning movement of the substrate 23 in the X direction results in joint exposure over the entire width in the Y direction. In the case of the arrangement shown in FIG. 71, the first exposure is performed by scanning movement in the +X direction, and then the second exposure is performed by scanning movement in the –X direction without changing the position of the substrate 23 in the Y direction.

In addition, as shown in FIG. 7C, a mode of joint exposure using only one row of projection modules 17A is also possible. In this case, using a scan-and-step method, the substrate 23 is moved as follows: scanning movement Xa in the +X direction, step movement Ya in the Y direction, scanning movement Xb in the –X direction, step movement Yb in the Y direction, scanning movement Xc in the +X direction, step movement Yc in the Y direction, scanning movement Xd in –X direction, and so on. A pattern corresponding to each region may be exposed during each of the scanning movements Xa, Xb, Xc, and Xd.

In the case of exposure using only two rows of one row of projection modules 17A and one row of projection modules 17B in the arrangement shown in FIG. 7B, joint exposure may also be performed by one round trip of scanning movement Xa in the +X direction, step movement Ya in the Y direction, and scanning movement Xb in the –X direction. In this case, the scanning movements Xa, Xb, Xc, and Xd and the step movements Ya, Yb, and Ye are equivalent to the movement trajectories Sa and Sb in FIG. 7A.

In a case where the entire pattern is exposed by the scanning movement or step movement of the substrate 23 in the +X (or –X) direction as shown in FIG. 7B or 7C, the amount of exposure (amount of DOSE) given to the resist on the substrate 23 can be increased by making the movement trajectory of the substrate 23 (the stage 14) during the first exposure and the movement trajectory of the substrate 23 (the stage 14) during the second exposure same as each other, and by making the patterns generated by each of the spatial light modulators 201 same as each other in the first and second exposures.

In a case where the amount of exposure is changed between the first exposure and the second exposure, the illuminance is adjusted using the variable neutral density filter 1623 in FIG. 3, or the illuminance sent to the optical fiber 19 within the light source unit 18 is adjusted. This makes it possible to use a resist with low sensitivity or to intentionally change the line width of a resist pattern after exposure and development.

Meanwhile, the line width may be intentionally changed slightly by shifting the movement trajectory of the first exposure and the movement trajectory of the second exposure in the X direction or the Y direction by an amount smaller than the designed line width to be exposed on the substrate 23. That is, the line width may be intentionally changed slightly by XY fine movement of each of the spatial light modulators 201, light change in the movement trajectory of the stage 14, or the like. In this case, since the drawing data of the pattern to be exposed may be the same for the first exposure and the second exposure, a step of partially modifying and correcting the drawing data for the second exposure with respect to the drawing data for the first exposure can be omitted, making it possible to precisely control the amount of exposure and control the line width and to improve productivity.

(Second Step)

The controller 21 (see FIG. 2) controls the operations of the illumination module 16, the light modulation unit 20, the projection module 17, and the stage 14 so that the same exposure pattern is repeatedly formed multiple times. Specifically, the exposure processing (second exposure) of the exposure target 23 is performed so as to form the same movement trajectory Sb as the movement trajectory Sa in the first exposure. The movement trajectory Sa in the first exposure and the movement trajectory Sb in the second exposure are, for example, patterns having the same shape and the same size. In the second step, the second exposure is performed on the basis of the same information as the information relating to the movement trajectory Sa used in the first step. The exposure conditions for the second step may be the same as the exposure conditions for the first step. The pulse emission timing of the exposure module, the movement speed of the stage 14, and the like are the same in the first step and the second step. Therefore, in the second step, the data of the exposure processing used in the first step can be used. In FIG. 7A, the movement trajectory Sb (the second exposure pattern P2) is indicated by a two-dot chain line.

The movement trajectory Sa of the first exposure pattern P1 and the movement trajectory Sb of the second exposure pattern P2 are irradiated onto, for example, the exposure target 23 so that at least some of them overlap each other. Therefore, the exposure target 23 is exposed multiple times (specifically, twice). The movement trajectory Sa and the movement trajectory Sb may be irradiated onto the exposure target 23 so that all of them overlap each other, or may be irradiated onto the exposure target 23 so that only some of them overlap each other.

The number of repetitions of the exposure pattern may be plural (any number equal to or greater than 2). It is preferable that a plurality of movement trajectories be irradiated onto the exposure target so that at least some of two or more of these movement trajectories overlap each other. For example, the movement trajectory Sb may be a pattern equivalent to a portion (for example, only the first half) of the movement trajectory Sa.

The second exposure pattern P2 need only be formed on the basis of at least a portion of the information relating to the movement trajectory Sa used to form the first exposure pattern P1. That is, at least a portion of the information relating to the exposure pattern (the movement trajectory Sa) need only be used multiple times. In the second step, the effect of suppressing an increase in the amount of data in the storage (such as a memory) is obtained by using at least a portion of the information relating to the movement trajectory Sa used to form the first exposure pattern P1. Meanwhile, the exposure conditions for the second step may not be completely the same as the exposure conditions for the first step.

For example, the focus may be different between the exposure conditions for the first step and the exposure conditions for the second step. For example, the first exposure pattern P1 may be defocused, and the second exposure pattern P2 may be in best focus. The first exposure pattern may be defocused to one of the projection module 17 side and the exposure target (the substrate 23) side, and the second exposure pattern may be defocused to the other of the projection module 17 side and the exposure target (the substrate 23) side. The focus can be adjusted by the focus adjustment unit 172 (see FIG. 3). This makes it possible to secure sufficient depth of focus.

In addition to the above-mentioned exposure conditions, at least one or more of the amount of exposure, telecentricity, a polarization direction (circular polarization or linear polarization), an exposure wavelength, a scanning speed, the inclination of scanning direction, illumination σ (numerical aperture of the illumination optical system/numerical aperture of the projection optical system), light intensity distribution at the pupil position of the illumination optical system (modified illumination), and an exposure position may be made different between the first step and the second step. For example, by appropriately varying the amount of exposure between the first step and the second step, it is possible to suitably expose a material that exhibits a non-linear response to the amount of exposure such as a non-linear resist even if the material is an exposure target. For example, by appropriately varying the telecentricity between the first step and the second step, a telecentric error can be reduced. For example, by appropriately varying the exposure wavelength between the first step and the second step, speckles and standing wave effects can be suppressed. For example, by appropriately varying the scanning speed and the inclination of the scanning direction between the first step and the second step, the contrast of the pattern can be averaged. For example, by appropriately varying the illumination σ and the light intensity distribution (such as annular distribution, quadrupolar distribution, or bipolar distribution) at the pupil position of the illumination optical system between the first step and the second step, the dose amount can be adjusted or the imaging state can be changed. For example, by appropriately varying the exposure position between the first step and the second step (tor example, shifting the exposure position by half a pitch of one DMD pixel), the resolution can be improved and the speckles can also be suppressed.

In one of the first step and the second step, a portion of the optical path of the illumination optical system may be blocked by a light shielding member. For example, in a case where the module shutter 161 is used as a light shielding member, a pattern of which the illuminance is lowered as a whole is obtained, that is, a pattern of which the line width is changed is obtained. In addition, for example, when the light shielding member is disposed between the plane mirror 162F and the spatial light modulator 201, a pattern of which the illuminance is partially lowered is obtained, that is, a pattern of which the line width is changed is obtained. Thereby, the first exposure pattern P1 and the second exposure pattern P2 become different patterns. For example, in the second step, the second exposure pattern P2 different from the first exposure pattern P1 can be obtained by blocking a portion of the optical path of the illumination optical system using the light shielding member. Even in this case, in the second step, the data of the exposure processing used in the first step can be used, and thus an increase in the amount of data in the storage (such as a memory) can be suppressed.

In the exposure apparatus 1, the exposure target 23 is exposed using at least a portion of the information relating to the exposure pattern stored in the storage multiple times. In the second step, the data of the exposure processing used in the first step can be used, and thus the amount of data in the storage (such as a memory) of the controller 21 can be suppressed. Thus, the exposure apparatus 1 can cope with a wide variety of exposure processing without squeezing the capacity of the storage of the controller 21.

In the exposure apparatus 1, the first exposure pattern P1 and the second exposure pattern P2 are irradiated onto the exposure target 23 so that at least some of them overlap each other, and thus high-dose exposure can be realized in a region where the first exposure pattern P1 and the second exposure pattern P overlap each other. In the exposure apparatus 1, it is possible to perform exposure processing in which exposure irregularities for each exposure pattern are averaged by multiple exposures that overlap at least partially.

In the exposure method using the exposure apparatus 1, at least a portion of the information relating to the exposure pattern stored in the storage is used multiple times to expose the exposure target 23. In the second step, the data of the exposure processing used in the first step can be used, and thus the amount of data in the storage (such as a memory) of the controller 21 can be suppressed. Thus, the exposure apparatus 1 can cope with a wide variety of exposure processing without squeezing the capacity of the storage of the controller 21.

In this exposure method, the first exposure pattern P1 and the second exposure pattern P2 are irradiated onto the exposure target 23 so that at least some of them overlap each other, and thus high-dose exposure can be realized in a region where the first exposure pattern P1 and the second exposure pattern P2 overlap each other. In this exposure method, it is possible to perform exposure processing in which exposure irregularities for each exposure pattern are averaged by multiple exposures that overlap at least partially.

A group of data corresponding to all patterns exposed by each of the projection regions 201a, 201b. 201c, and 201d shown in FIGS. 7B and 7C is applied to the spatial light modulator 201 at high speed while the substrate 23 is scanned and moved in the X direction. By partially turning off the application of the group of data in the middle of the scanning movement, it is also possible to turn off multiple (twice) exposure in some regions on the substrate 23. That is, a portion of the first exposure pattern (P1) formed in the first exposure undergoes multiple exposure with the second exposure pattern (P2) having the same shape in the second exposure.

The exposure apparatus 1 may include a master clock (an oscillator emits a master clock) (not shown) serving as a reference for synchronization. In the exposure apparatus 1, devices such as, for example, the stage 14, the illumination module 16, the projection module 17, and the light modulation unit 20 may be driven with the master clock as a reference. The controller 21 can control the operation of each device with the master clock as a reference. By referring to the master clock, the operation timing of each device is adjusted individually and appropriately, and the relationship between the operation timings of a plurality of device is set appropriately.

Figure 8:
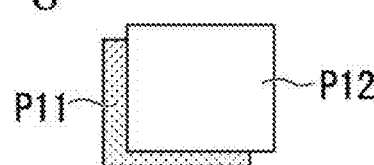
FIG. 8 is a plan view schematically illustrating a second example of the exposure pattern.

FIG. 8 is a plan view schematically illustrating a second example of the exposure pattern. As shown in FIG. 8, a first exposure pattern P11 and a second exposure pattern P12 have the same shape (rectangle) and the same size. The first exposure pattern P11 and the second exposure pattern P12 are located at different positions but overlap each other in some regions.

In this example, since the first exposure pattern P11 and the second exposure pattern P12 are the same pattern, the data used in the first step can be used in the second step. Therefore, the amount of data in the storage (such as a memory) of the controller 21 can be suppressed. Since the first exposure pattern P11 and the second exposure pattern P12 are irradiated onto the exposure target so that some of them overlap each other, high-dose exposure can be realized.

Figure 9:
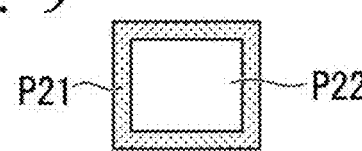
FIG. 9 is a plan view schematically illustrating a third example of the exposure pattern.

FIG. 9 is a plan view schematically illustrating a third example of the exposure pattern. As shown in FIG. 9, a first exposure pattern P21 and a second exposure pattern P22 have the same shape (rectangular), but the second exposure pattern P22 has a smaller size. The first exposure pattern P21 encompasses the second exposure pattern P22.

In this example, since the first exposure pattern P21 and the second exposure pattern P22 have the same shape (similar shape), the data used in the first step can be used in the second step. Therefore, the amount of data in the storage (such as a memory) of the controller 21 can be suppressed. Since the first exposure pattern P21 and the second exposure pattern P22 are irradiated onto the exposure target so that some of them overlap each other, high-dose exposure can be realized.

Figure 10:
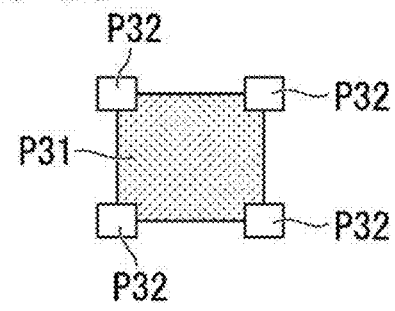
FIG. 10 is a plan view schematically illustrating a fourth example of the exposure pattern.

FIG. 10 is a plan view schematically illustrating a fourth example of the exposure pattern. As shown in FIG. 10, a first exposure pattern P31 and a second exposure pattern P32 have the same shape (rectangular), but the second exposure pattern P32 has a smaller size. The second exposure pattern P32 encompasses four corners of the first exposure pattern P31.

In this example, since the first exposure pattern P31 obtained by the first exposure and the second exposure pattern P32 obtained by the second exposure have the same arrangement shape (similar shape) the data used in the first step can be used in the second step. However, the second exposure pattern P32 in FIG. 10 is exposed by drawing data which is partially corrected so that only a group of rectangular pixels located at each of the four corners enters an on state using the drawing data of the first exposure pattern P31.

Therefore, the amount of data in the storage (such as a memory) of the controller 21 can be suppressed. Since the first exposure pattern P31 and the second exposure pattern P32 are irradiated onto the exposure target so that some of them overlap each other, high-dose exposure can be realized at the four overlapping corners.

In addition, in the case of FIG. 10, the exposure conditions (at least one of the amount of exposure, a focus position, the numerical aperture of the projection module 17, an illumination σ value, telecentricity, a polarization direction, an exposure wavelength, a scanning speed, the inclination of the scanning direction, light intensity distribution at the pupil position of the illumination optical system, and the like) can also be made different between the first exposure and the second exposure.

In the exposure apparatus 1, one projection module 17 (for example, the first projection module 17A) and another projection module 17 (for example, the second projection module 17B) may perform joint exposure.

[Method of Manufacturing Electronic Device]

The exposure apparatus 1 can manufacture an electronic device such as a liquid crystal display (flat panel display) using the above-described exposure method.

Meanwhile, the disclosures of all US Patent Application Publication Specifications and US Patent Specifications relating to exposure apparatus and the like cited in the above embodiment are incorporated herein by reference into a portion of the description of this specification.

Hereinbefore, although an embodiment of this invention has been described in detail with reference to the accompanying drawings, specific configurations are not limited to those described above, and various design changes and the like can be made without departing from the scope of this invention.

REFERENCE SIGNS LIST

1 Exposure apparatus
14 Stage
17 Projection module (projection optical system)
21 Controller
162 Illumination optical system
201 Spatial light modulator
P1 First exposure pattern
P2 Second exposure pattern

What is claimed is:

1. An exposure apparatus comprising:
an exposure module system that includes a spatial light modulator forming a light intensity distribution and that irradiates a resist layer of a substrate with light emitted from the spatial light modulator
a stage that moves the substrate in a scanning direction with respect to the exposure module system; and
a controller that controls exposure of the resist layer,
wherein the controller controls the exposure of the resist layer so that a first step of performing a first exposure of the resist layer based on information of an arrangement or shape of an exposure pattern and a second step of performing a second exposure of the resist layer based on at least a portion of the information are executed, and
wherein each of the first step and the second step includes:
moving, with respect to the spatial light modulator, the stage on which the substrate is mounted from a first side to a second side in the scanning direction so that light from the exposure module system is projected onto a first region extending in the scanning direction in the resist layer, the second side being opposite to the first side;
after moving, with respect to the spatial light modulator, the stage on which the substrate is mounted from the first side to the second side, moving the stage on which the substrate is mounted in a direction intersecting the scanning direction; and
after moving the stage on which the substrate is mounted in the direction intersecting the scanning direction, moving, with respect to the spatial light modulator, the stage on which the substrate is mounted from the second side to the first side in the scanning direction so that the light from the exposure module system is projected onto a second region, which includes a region overlapping with the first region and a region other than the region overlapping with the first region.

2. The exposure apparatus according to claim 1, wherein, in the second step, the second exposure is performed based on the same information as the information.

3. The exposure apparatus according to claim 1, wherein the first step and the second step have different exposure conditions, and
wherein the exposure conditions include at least one of an amount of exposure, a polarization direction, an exposure wavelength, a scanning speed, an inclination of a scanning direction, and illumination σ.

4. The exposure apparatus according to claim 1, wherein a first exposure pattern formed by the first exposure and a second exposure pattern formed by the second exposure overlap each other partially and do not overlap each other partially.

5. An exposure method of exposing an exposure target using an exposure apparatus,
wherein the exposure apparatus comprises:
an illumination optical system;
a first spatial light modulator which is illuminated by a first illumination light from the illumination optical system;
a first projection optical system that irradiates an exposure target with light emitted from the first spatial light modulator;
a second spatial light modulator into which a second illumination light enters;

a second projection optical system into which the second illumination light emitted from the second spatial light modulator enters;

a stage that moves the exposure target in a scanning direction with respect to the first projection optical system and the second projection optical system; and a controller that controls exposure for the exposure target, wherein the method comprises:

a first step of performing a first exposure based on information of an arrangement or shape of an exposure pattern; and a second step of performing a second exposure based on at least a portion of the information, and wherein, in each of the first step and the second step, the following are performed in order:

(1) moving the stage from one side to another side in the scanning direction so that (i) the first illumination light is projected onto a first region extending in the scanning direction in the exposure target and (ii) the second illumination light is projected onto a second region extending in the scanning direction in the exposure target;

(2) moving the stage in a direction intersecting the scanning direction; and (3) moving the stage from the other side to the one side in the scanning direction so that (i) the first illumination light is projected onto a third region, which includes a region overlapping with the first region and a region other than the region overlapping with the first region, and (ii) the second illumination light is projected onto a fourth region, which includes a region overlapping with the second region and a region other than the region overlapping with the second region.

6. The exposure method according to claim 5, wherein, in the second step, the second exposure is performed based on the same information as the information.

7. The exposure method according to claim 5, wherein the first step and the second step have different exposure conditions, and wherein the exposure conditions include at least one of a focus, an amount of exposure, telecentricity, a polarization direction, an exposure wavelength, a scanning speed, an inclination of a scanning direction, illumination σ, light intensity distribution at a pupil position of the illumination optical system, and an exposure position.

8. The exposure method according to claim 5, wherein a first exposure pattern formed by the first exposure and a second exposure pattern formed by the second exposure overlap each other partially and do not overlap each other partially.

9. A method of manufacturing an electronic device, the method comprising exposing the exposure target using the exposure method according to claim 5.

10. A method of controlling an exposure apparatus, wherein the exposure apparatus comprises:

an exposure module system that includes a spatial light modulator forming a light intensity distribution and that irradiates a resist layer of a substrate with light emitted from the spatial light modulator; and a stage that moves the substrate in a scanning direction with respect to the exposure module system, wherein the method comprises:

a first step of performing a first exposure of the resist layer based on information of an arrangement or shape of an exposure pattern; and a second step of performing a second exposure of the resist layer based on at least part of the information, after the first step is executed, and wherein each of the first step and the second step includes:

moving, with respect to the spatial light modulator, the stage on which the substrate is mounted from a first side to a second side in the scanning direction so that the light from the exposure module system is projected onto a first region extending in the scanning direction in the resist layer;

after moving, with respect to the first spatial light modulator, the stage on which the substrate is mounted from the first side to the second side, moving the stage on which the substrate is mounted in a direction intersecting the scanning direction; and after moving the stage on which the substrate is mounted in the direction intersecting the scanning direction, moving the stage on which the substrate is mounted from the second side to the first side in the scanning direction so that the light from the exposure module system is projected onto a second region, which includes a region overlapping with the first region and a region other than the region overlapping with the first region.

11. The method according to claim 10, wherein the stage is moved before starting the second exposure so that a position on the first region where the projecting the light starts in the second step overlaps with a position on the first region where the projecting the light starts in the first step.

12. The method according to claim 11, wherein the position on the first region where the projecting the light starts in the second step and the position on the first region where the projecting the light starts in the first step are shifted in a direction intersecting the scanning direction.

13. The method according to claim 10, wherein the exposure module system includes an illumination optical system that illuminates the spatial light modulator with a first illumination light, wherein the illumination optical system includes a light shielding member that blocks at least a part of the first illumination light entering into the spatial light modulator, and wherein the light shielding member is moved so that the amount of the first illumination light entering into a fly-eye lens in the second step changes with respect to the amount of the first illumination light entering into the fly-eye lens in the first step.

14. The method according to claim 10, wherein a first exposure pattern formed by the first step and a second exposure pattern formed by the second step overlap each other partially and do not overlap each other partially.

15. The exposure apparatus according to claim 1, wherein the exposure module system includes a filter capable of adjusting illuminance, wherein the spatial light modulator is disposed so that light passed through the filter is irradiated on the spatial light modulator, and wherein the illuminance of light passed through the filter is adjustable in each of the first step and the second step.

16. The exposure apparatus according to claim 15, wherein an exposure amount that cannot be achieved by the first step alone is achieved by performing the first step and the second step.

17. The exposure apparatus according to claim 1, wherein the spatial light modulator of the exposure module system is a first spatial light modulator, wherein the exposure module system further includes:

a first projection optical system that projects light from the first spatial light modulator onto the resist layer;

a second spatial light modulator; and a second projection optical system that projects light from the second spatial light modulator onto the resist layer, and wherein each of the first step and second step includes:

moving the stage on which the substrate is mounted from the first side to the second side in the scanning direction so that light from the first and second projection optical systems irradiates the first region;

after moving the stage on which the substrate is mounted from the first side to the second side in the scanning direction, moving the stage in a direction intersecting the scanning direction; and after moving the stage on which the substrate is mounted in the direction intersecting the scanning direction, moving the stage from the second side to the first side in the scanning direction so that light from the first and second projection optical systems irradiates the second region.

18. The exposure apparatus according to claim 1, wherein the spatial light modulator of the exposure module system is a first spatial light modulator, wherein the exposure module system further includes a first projection optical system that projects light from the first spatial light modulator onto the resist layer, and wherein each of the first and second steps includes:

moving the stage on which the substrate is mounted from the first side to the second side in the scanning direction so that light from the first projection optical system irradiates the first region;

after moving the stage on which the substrate is mounted from the first side to the second in the scanning direction, moving the stage in a direction intersecting the scanning direction; and after moving the stage in the direction intersecting the scanning direction, moving the stage from the second side to the first side in the scanning direction so that light from the first projection optical system irradiates the second region.

19. The exposure apparatus according to claim 1, wherein the exposure module system includes a projection optical system;

wherein the spatial light modulator includes a plurality of tiltable mirrors capable of taking a plurality of states;

wherein light from a first-state mirror among the plurality of tiltable mirrors enters the projection optical system; and wherein light from a second-state mirror among the plurality of mirrors enters outside the projection optical system.

20. The exposure apparatus according to claim 1, comprising:

a light source unit that supplies pulse light, wherein the spatial light modulator is disposed so that the pulse light is irradiated on the spatial light modulator; and wherein a timing of light emission of the pulse light is the same in each of the first and second steps.

21. The exposure apparatus according to claim 1, comprising:

a storage that stores data of the arrangement or the shape of the exposure pattern, wherein the controller uses the data to control the first step and uses the data to control the second step.

22. The exposure apparatus according to claim 1, wherein the controller shifts an exposure position in the second step relative to an exposure position in the first step; and wherein an amount of shift of the exposure position is at most half of a width corresponding a pixel pitch of the spatial light modulator.

23. The exposure apparatus according to claim 1, wherein a positional deviation between a movement trajectory of exposure in the first step and a movement trajectory of exposure in the second step is smaller than a designed linewidth of a pattern exposed on the resist layer.

24. The exposure apparatus according to claim 1, wherein the controller controls exposure in at least one step of the first step and the second step in a manner that achieves the best focus.

25. The exposure apparatus according to claim 1, wherein the controller varies telecentricity in the second step relative to that in the first step.

26. The method according to claim 10, wherein the exposure module system includes a filter capable of adjusting illuminance, wherein the spatial light modulator is disposed so that light passed through the filter is irradiated on the spatial light modulator, wherein the illuminance of light passed through the filter is adjustable in each of the first step and the second step, and wherein an exposure amount that cannot be achieved by the first step alone is achieved by performing the first step and the second step.

27. The method according to claim 10, further comprising shifting an exposure position in the second step relative to an exposure position in the first step, wherein an amount of shift of the exposure position is at most half of a width corresponding to a pixel pitch of the spatial light modulator.

28. The method according to claim 10, further comprising performing exposure in at least one step of the first step and the second step in a manner that achieves the best focus.

* * * * *